(12) United States Patent
Sprafke et al.

(10) Patent No.: US 11,882,659 B2
(45) Date of Patent: Jan. 23, 2024

(54) CHIP SUBSTRATE FOR REDUCING THERMAL LOAD ON A CHIP ASSEMBLY MOUNTED THEREON

(71) Applicant: Raytheon Company, Waltham, MA (US)

(72) Inventors: Thomas Sprafke, Huntsville, UT (US); Stephen Marinsek, Albuquerque, NM (US)

(73) Assignee: Raytheon Company, Tewksbury, MA (US)

( * ) Notice: Subject to any disclaimer, the term of this patent is extended or adjusted under 35 U.S.C. 154(b) by 100 days.

(21) Appl. No.: 17/505,730

(22) Filed: Oct. 20, 2021

(65) Prior Publication Data

US 2022/0132669 A1 Apr. 28, 2022

Related U.S. Application Data

(60) Provisional application No. 63/094,975, filed on Oct. 22, 2020.

(51) Int. Cl.
| | |
|---|---|
| *H05K 1/18* | (2006.01) |
| *H05K 3/32* | (2006.01) |
| *H05K 1/03* | (2006.01) |
| *H05K 1/09* | (2006.01) |

(52) U.S. Cl.
CPC ............. *H05K 1/18* (2013.01); *H05K 3/32* (2013.01); *H05K 1/0306* (2013.01); *H05K 1/09* (2013.01); *H05K 2201/09036* (2013.01); *H05K 2201/10151* (2013.01); *H05K 2201/10189* (2013.01); *H05K 2201/10287* (2013.01); *H05K 2201/10378* (2013.01)

(58) Field of Classification Search
CPC .......... H05K 1/09; H05K 1/0306; H05K 3/32; H05K 2201/09036; H05K 2201/10151
USPC ........................................................ 361/779
See application file for complete search history.

(56) References Cited

U.S. PATENT DOCUMENTS

| | | | | |
|---|---|---|---|---|
| 6,083,633 | A * | 7/2000 | Fister | B32B 15/01 428/656 |
| 2009/0257614 | A1* | 10/2009 | Mei | H04R 19/04 381/355 |
| 2010/0102838 | A1* | 4/2010 | Kitazume | G01R 1/06727 324/756.03 |
| 2021/0227684 | A1* | 7/2021 | Wang | H05K 1/0243 |

* cited by examiner

*Primary Examiner* — Andargie M Aychillhum
(74) *Attorney, Agent, or Firm* — Renner, Otto, Boisselle & Sklar LLP

(57) ABSTRACT

A chip substrate includes a base substrate having a plurality of base circuit traces mounted thereon for supporting a chip assembly and an intermediate substrate mounted on the base substrate adjacent the plurality of base circuit traces. The intermediate substrate has a plurality of intermediate circuit traces mounted thereon. Each of the plurality of intermediate circuit traces are wirebonded to a respective one of the plurality of base circuit traces and the plurality of intermediate circuit traces are configured to be electrically coupled to an external device. For example, each of the plurality of intermediate circuit traces may be wirebonded to a respective one of a plurality of feedthrough circuit traces mounted on a feedthrough device.

18 Claims, 3 Drawing Sheets

US 11,882,659 B2

CHIP SUBSTRATE FOR REDUCING THERMAL LOAD ON A CHIP ASSEMBLY MOUNTED THEREON

This application is a Secondary which claims priority of U.S. Application No. 63/094,975, filed Oct. 22, 2020, the entire disclosure of which is hereby incorporated by reference.

TECHNICAL FIELD

The present disclosure relates generally to chip assemblies and more particularly to devices and methods for reducing thermal load on chip assemblies mounted thereon.

BACKGROUND

Chip assemblies (e.g., sensor chip assemblies) typically experience thermal load transfer from an external device to which a detector of the chip assembly is electrically connected. For example, with reference to FIG. 1, a hermetically sealed dewar container 10 housing a chip assembly 12 (e.g., a sensor chip assembly) under a vacuum is depicted. A feedthrough device 14 is provided to electrically couple the chip assembly 12 within the vacuum to an external device (not pictured) outside of the vacuum. While the junction of the feedthrough device 14 and a housing of the dewar container 10 is hermetically sealed, so as to maintain the vacuum within the dewar container 10, the wirebond connection between the feedthrough device 14 and a substrate 16 of the chip assembly 12 provides a path for thermal load transfer between the external device and a detector 18 of the chip assembly 12 inside the dewar container 10. Specifically, with reference to FIG. 2, the substrate 16 includes a plurality of substrate circuit traces 17 which are each wirebonded to a respective one of a plurality of feedthrough circuit traces 19.

Such thermal load transfer to the chip assembly 12 may be detrimental to the performance of the detector 18. Therefore, it is important to mitigate such thermal load transfer to the chip assembly 12. Existing approaches to help mitigate thermal load transfer to the chip assembly 12 include providing a cooling source (not pictured) within the dewar container 10, such as in the cooling chamber 20 depicted in FIG. 1, to help cool the chip assembly 12 mounted above the cooling chamber 20. However, in some instances, the size and thermal capacity of such cooling source must be large to sufficiently mitigate the thermal load transfer between the external device and the chip assembly.

SUMMARY

In a general embodiment, a modified chip substrate (e.g., a sensor chip substrate) of a chip assembly (e.g., a sensor chip assembly) is configured to reduce the thermal load transfer from an external device to the chip assembly. The chip substrate includes a base substrate and an intermediate substrate mounted on the base substrate. The base substrate includes a plurality of base circuit traces and the intermediate substrate includes a plurality of intermediate circuit traces each wirebonded to a respective one of the plurality of base circuit traces. The plurality of intermediate circuit traces are configured to be electrically coupled to an external device so as to electrically couple the external device to the chip assembly. For example, a feedthrough device having a plurality of feedthrough circuit traces may be provided and each of the plurality of intermediate circuit traces may be wirebonded to a respective one of the plurality of feedthrough circuit traces. The feedthrough device, therefore, may be electrically coupled to the external device and may serve to electrically couple the external device to the chip assembly.

According to an aspect of this disclosure, therefore, a chip substrate includes a base substrate having a plurality of base circuit traces mounted thereon for supporting a chip assembly. The chip assembly also includes an intermediate substrate mounted on the base substrate adjacent the plurality of base circuit traces. The intermediate substrate has a plurality of intermediate circuit traces mounted thereon. Each of the plurality of intermediate circuit traces are wirebonded to a respective one of the plurality of base circuit traces. The plurality of intermediate circuit traces are therefore configured to be electrically coupled to an external device.

According to an embodiment of any paragraph(s) of this summary, a material of the base substrate has a first thermal conductivity and a material of the intermediate substrate has a second thermal conductivity that is lower than the first thermal conductivity.

According to another embodiment of any paragraph(s) of this summary, the second thermal conductivity lower than the first thermal conductivity by a factor that is within an order of magnitude of 50.

According to another embodiment of any paragraph(s) of this summary, the material of the base substrate is any one of aluminate ($AlO_2$) and aluminum nitride (AlN).

According to another embodiment of any paragraph(s) of this summary, the material of the intermediate substrate is at least one of steatite, yttria, forsterite, cordierite, and zirconia.

According to another embodiment of any paragraph(s) of this summary, the plurality of intermediate circuit traces are each wirebonded to a respective one of the plurality of base circuit traces with a respective gold wirebond.

According to another embodiment of any paragraph(s) of this summary, the plurality of intermediate circuit traces are each wirebonded to a respective one of the plurality of base circuit traces with a respective silver wirebond.

According to another embodiment of any paragraph(s) of this summary, the plurality of base circuit traces and the plurality of intermediate circuit traces are made of gold.

According to another embodiment of any paragraph(s) of this summary, at least a portion of the intermediate substrate is spaced apart from the base substrate with a gap between the portion of the intermediate substrate and the base substrate.

According to another aspect of this disclosure, a chip substrate assembly includes a chip substrate having a base substrate. The base substrate has a plurality of base circuit traces mounted thereon for supporting a chip assembly. The chip substrate also includes an intermediate substrate mounted on the base substrate adjacent the plurality of base circuit traces. The intermediate substrate has a plurality of intermediate circuit traces mounted thereon. Each of the plurality of intermediate circuit traces are wirebonded to a respective one of the plurality of base circuit traces. The chip substrate assembly also includes a feedthrough device having a plurality of feedthrough circuit traces mounted thereon. Each of the plurality of feedthrough circuit traces are wirebonded to a respective one of the plurality of intermediate circuit traces.

According to another aspect of this disclosure, a method of electrically coupling a chip assembly mounted on a base substrate to an external device includes the step of mounting an intermediate substrate on the base substrate adjacent a plurality of base circuit traces mounted on the base substrate.

The intermediate substrate includes a plurality of intermediate circuit traces mounted thereon. The method also includes the step of wirebonding each of the plurality of intermediate circuit traces to a respective one of the plurality of base circuit traces, and electrically coupling each of the plurality of intermediate circuit traces to the external device.

According to an embodiment of any paragraph(s) of this summary, the step of electrically coupling each of the plurality of intermediate circuit traces to the external device includes the steps of providing a feedthrough device having a plurality of feedthrough circuit traces mounted thereon, and wirebonding each of the plurality of feedthrough circuit traces to a respective one of the plurality of intermediate circuit traces on the intermediate substrate.

According to another embodiment of any paragraph(s) of this summary, the step of wirebonding each of the plurality of intermediate circuit traces to a respective one of the plurality of base circuit traces includes wirebonding each of the plurality of intermediate circuit traces to a respective one of the plurality of base circuit traces with a respective gold wirebond.

According to another embodiment of any paragraph(s) of this summary, the step of wirebonding each of the plurality of intermediate circuit traces to a respective one of the plurality of base circuit traces includes wirebonding each of the plurality of intermediate circuit traces to a respective one of the plurality of base circuit traces with a respective silver wirebond.

According to another embodiment of any paragraph(s) of this summary, the step of mounting the intermediate substrate on the base substrate includes spacing at least a portion of the intermediate substrate apart from the base substrate such that a gap is provided between the portion of the intermediate substrate and the base substrate.

The following description and the annexed drawings set forth in detail certain illustrative embodiments of this disclosure. These embodiments are indicative, however, of but a few of the various ways in which the principles of this disclosure may be employed. Other objects, advantages and novel features of this disclosure will become apparent from the following detailed description of this disclosure when considered in conjunction with the drawings.

BRIEF DESCRIPTION OF DRAWINGS

The annexed drawings show various aspects of this disclosure.

DETAILED DESCRIPTION

Figure 1:
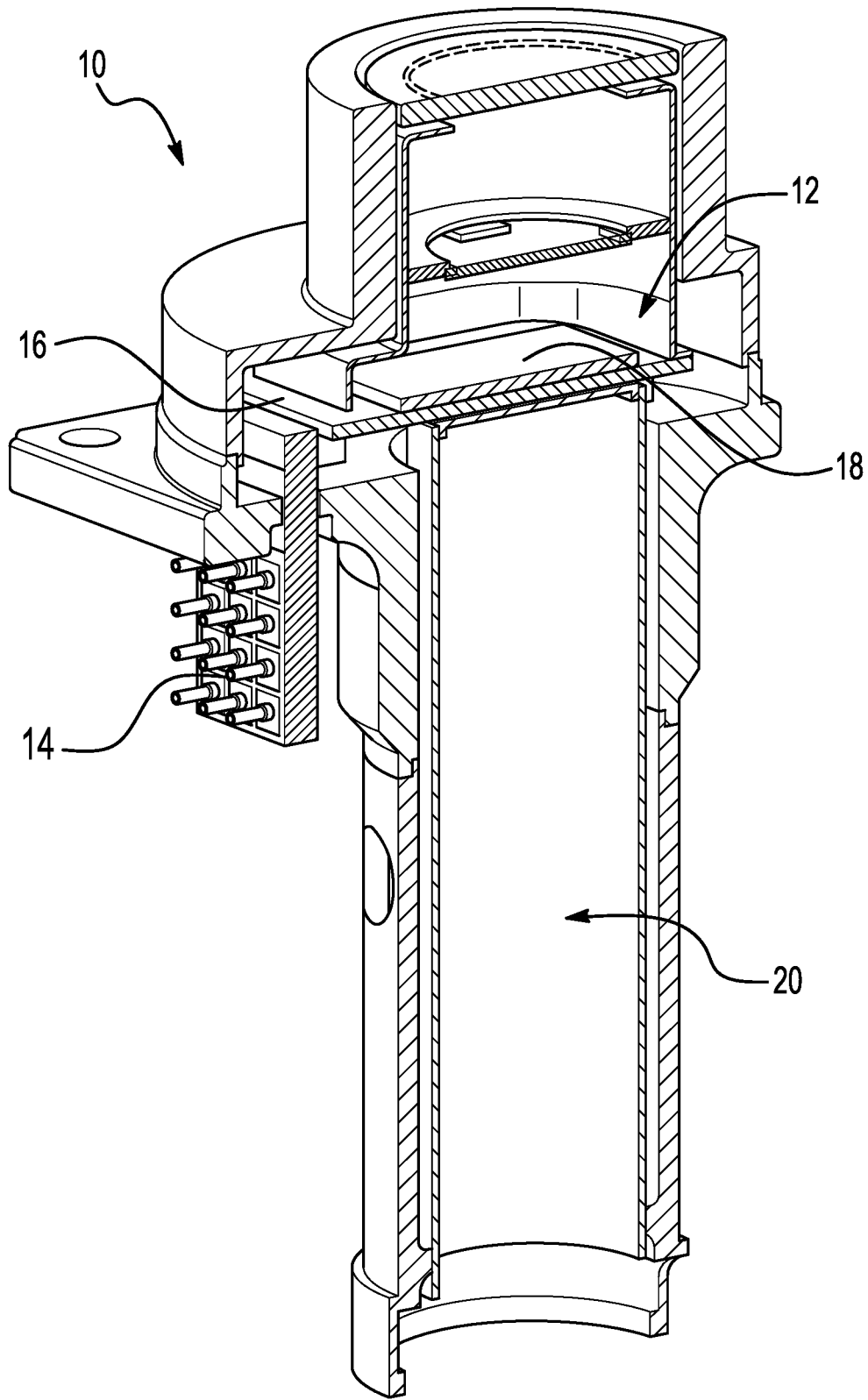
FIG. 1 is a cross-sectional perspective view of a conventional dewar container housing a conventional chip assembly.
Figure 2:
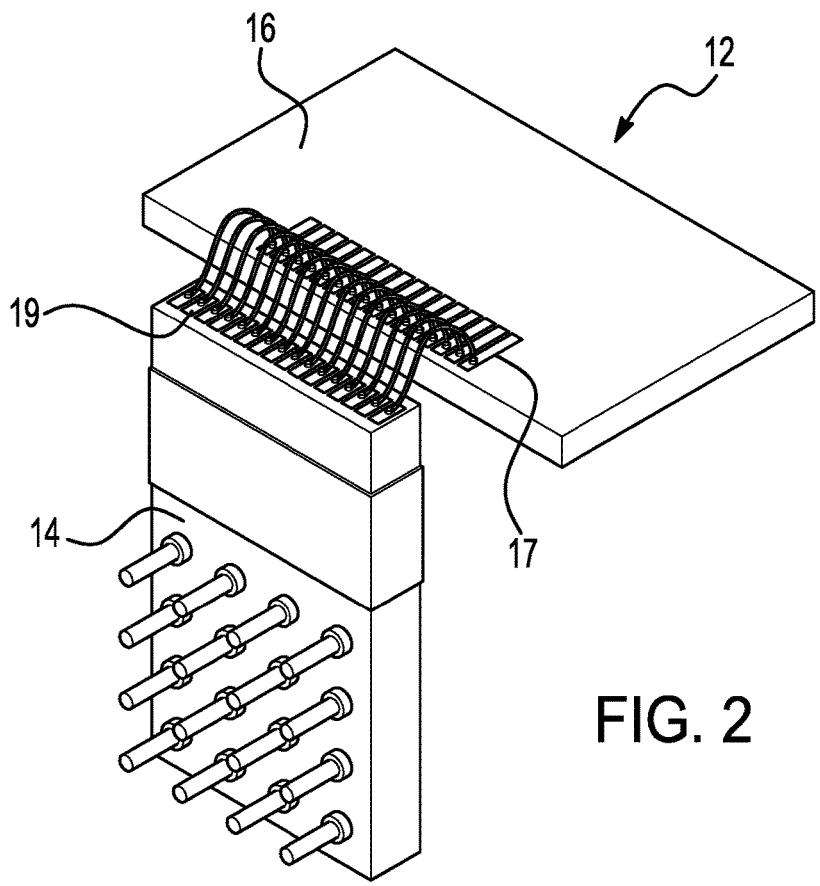
FIG. 2 is a perspective view of a conventional chip substrate assembly of the conventional chip assembly depicted in FIG. 1

According to a general embodiment, a chip substrate of a chip assembly includes a base substrate and an intermediate substrate. Unlike conventional chip substrates, which do not include an intermediate substrate mounted on a base substrate, the chip substrate reduces thermal load transfer from an external device to the chip assembly as compared to conventional chip substrates (FIG. 2). For example, with reference to FIG. 3, a substrate assembly 22 (e.g., a sensor chip substrate assembly) including a substrate 24 (e.g. a sensor chip substrate) is depicted. The chip substrate 24 includes a base substrate 26 and an intermediate substrate 28. The chip substrate 24 may be housed in a hermetically sealed dewar container, like that of FIG. 1, so as to be held under a vacuum. At least one of the base substrate 26 and the intermediate substrate 28 may be a 1024K×1024K substrate with a unit cell size in the range of 2 micrometers to 60 micrometers, 3 micrometers to 50 micrometers, 4 micrometers to 30 micrometers, 5 micrometers to 25 micrometers, or 8 micrometers to 16 micrometers.

The base substrate 26 includes a plurality of base circuit traces 30. Each of the plurality of base circuit traces 30 may have a size in the range of 0.001 inch (0.025 millimeter) to 0.100 inch (2.54 millimeter), 0.002 inch (0.05 millimeter) to 0.05 inch (1.27 millimeter), 0.003 inch (0.08 millimeter) to 0.04 inch (1.02 millimeter), 0.004 inch (0.10 millimeter) to 0.03 inch (0.76 millimeter), 0.005 inch (0.13 millimeter) to 0.02 inch (0.51 millimeter), or 0.007 inch (0.178 millimeter) to 0.01 inch (0.25 millimeter). The base circuit traces 30 are configured to be electrically coupled to a chip assembly (e.g., a sensor chip assembly; not pictured) mounted on the chip substrate 24. As a non-limiting example, the base circuit traces 30 may be made of gold. It is understood, however, that other materials may be used for the base circuit traces 30, such as for example silver.

The intermediate substrate 28 of the chip substrate 24 includes a plurality of intermediate circuit traces 32. The intermediate circuit traces 32 are configured to be electrically coupled to the base substrate 26. Specifically, each of the plurality of intermediate circuit traces 32 are wirebonded to a respective one of the plurality of base circuit traces 30. As a non-limiting example, the intermediate circuit traces 32 may be made of gold. Each of the plurality of intermediate circuit traces 32 may be wirebonded to a respective one of the plurality of base circuit traces 30 with, for example, a gold or silver wirebond. It is understood, however, that other materials may be used for the intermediate circuit traces 32 and the wirebond electrically coupling the intermediate circuit traces 32 to the base circuit traces 30, such as for example silver, copper, aluminum, or any combination thereof.

Figure 3:
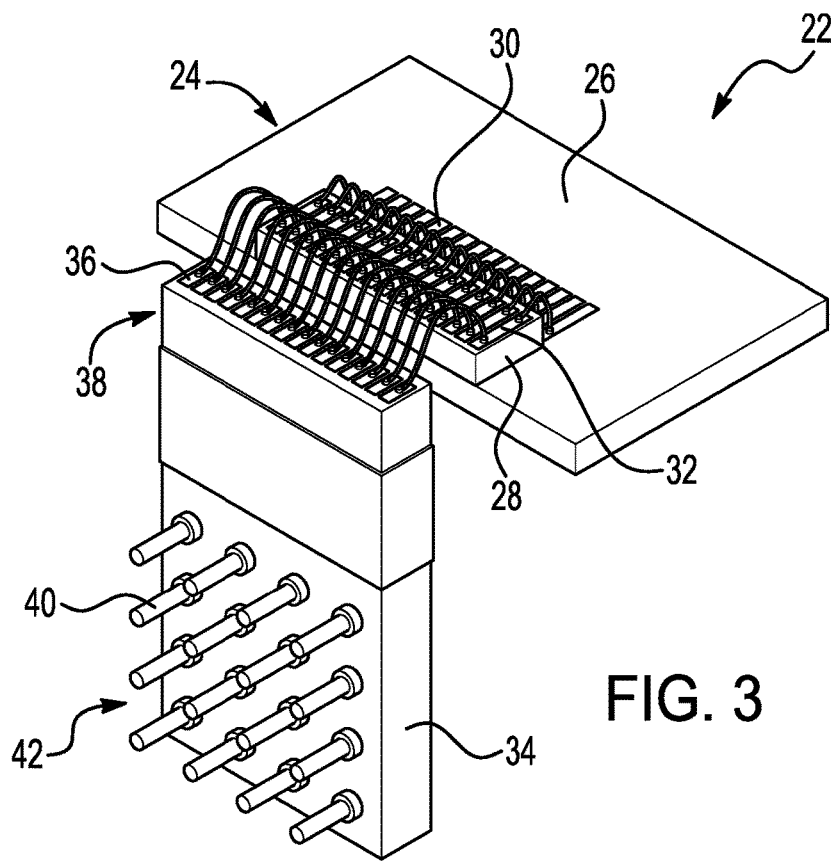
FIG. 3 is a perspective view of a chip substrate assembly.

The intermediate circuit traces 32 are also configured to be electrically coupled to an external device (not pictured) so as to electrically couple the external device to the chip assembly mounted on and electrically coupled to the chip substrate 24. As mentioned above, the chip substrate 24 may be housed in a hermetically sealed dewar container, like that of FIG. 1, so as to be held under a vacuum. Accordingly, as depicted in FIG. 3, the substrate assembly 22 may include a feedthrough device 34 configured to extend through a housing of the dewar container and electrically couple the chip substrate 24 under the vacuum to an external device outside of the vacuum. In this way, the feedthrough device 34 is configured to electrically couple the external device to the chip assembly mounted on the chip substrate 24 under the vacuum. The feedthrough device 34, therefore, may include a plurality of feedthrough circuit traces 36 on or near a first end 38 thereof, and may include pins 40 for electrically coupling the external device on or near a second end 42 thereof. The plurality of feedthrough circuit traces 36 on or near the first end 38 of the feedthrough device 34 may be housed and hermetically sealed within the dewar container under the vacuum along with the chip substrate 24 so as to be electrically coupled to the chip substrate 24 therein. Specifically, each of the plurality of feedthrough circuit traces 36 may be wirebonded to a respective one of the plurality of intermediate circuit traces 32 on the intermediate substrate 28 of the chip substrate 24. The pins 40 on or near the second end 42 of the feedthrough device 34 may be provided on an outside of the hermetically sealed dewar container such that the pins 40 may be electrically coupled to the external device. The feedthrough device 34 may include a seal ring 44 disposed around a periphery of the feedthrough device 34 for providing a hermetic seal between the feedthrough device 34 and a housing of the dewar container.

The chip substrate 24 disclosed herein reduces the thermal load transfer between the external device, and/or feedthrough device, and the chip assembly mounted on the chip substrate 24 by the addition of the intermediate substrate 28. That is, the intermediate substrate 24 may have a lower conductivity than the base substrate 26, reducing the thermal load transfer therethrough. Specifically, a material of the base substrate 26 may have a first thermal conductivity and a material of the intermediate substrate 28 may have a second thermal conductivity that is lower than the first thermal conductivity. For example, the second thermal conductivity of the material of the intermediate substrate 28 may be lower than the first thermal conductivity of the material of the base substrate 26 by a factor of about 50 or within an order of magnitude of 50, such as from 5 to 500, from 10 to 250, from 25 to 100, or from 40 to 60. The material of the base substrate may be any one of aluminate ($AlO_2$) and aluminum nitride (AlN). The material of the intermediate substrate 28 may be any one of steatite, yttria, forsterite, cordierite, and zirconia, or any suitable combination thereof. It is understood, however, that the listed materials of the base substrate 26 and the intermediate substrate 28 are provided as non-limiting examples and that other suitable materials may be applied to the base substrate 26 and the intermediate substrate 28 in accordance with this disclosure, such as for example titanium porcelain.

Figure 4:
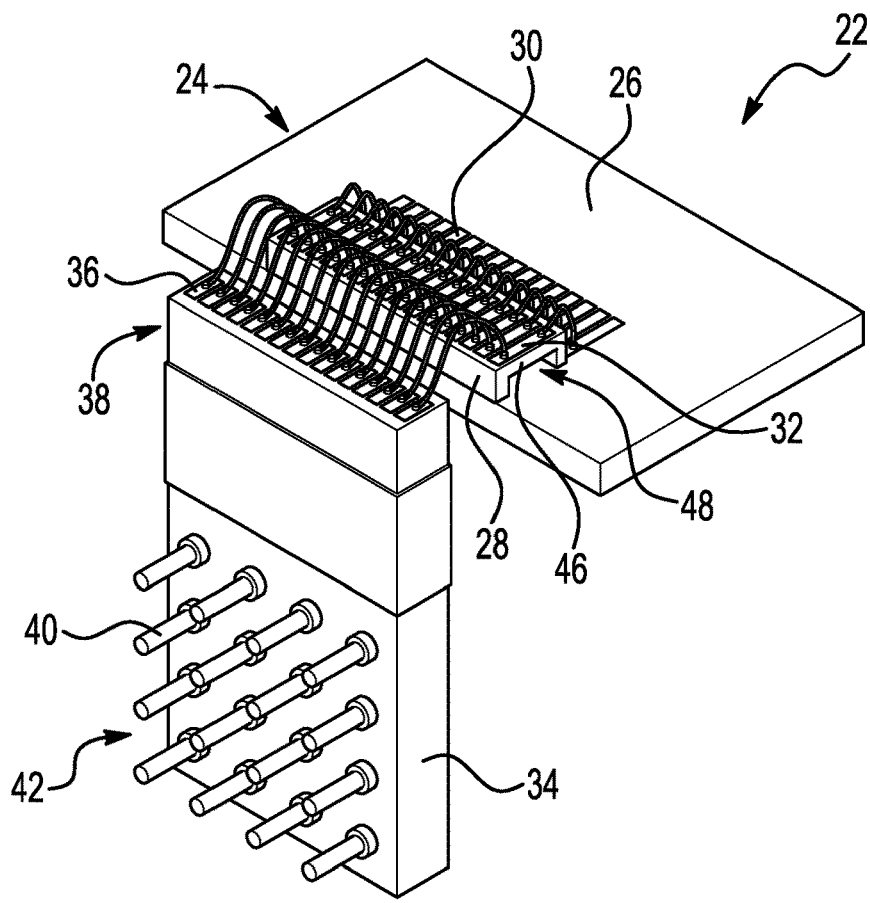
FIG. 4 is a perspective view of another chip substrate assembly.

With reference to FIG. 4, at least a portion 46 of the intermediate substrate 26 may be spaced apart from the base substrate 28 with a gap 48 disposed between the portion 46 of the intermediate substrate and the base substrate 28. This configuration further reduces the thermal load transfer between the external device, and/or the feedthrough device 34, and the chip assembly mounted on the chip substrate 24. That is, as air has a generally low thermal conductivity (especially at the low pressure under the vacuum within the hermetically sealed dewar container), providing the gap 48 in the path of the thermal load transfer, the thermal load on the chip substrate 24 may be further reduced. The portion 46 of the intermediate substrate 26 may be located anywhere on the intermediate substrate 26 and the gap 48 may have any shape or size relative to the intermediate substrate 26.

The substrate assembly 22 disclosed herein is capable of reducing the thermal load by approximately 50% as compared to conventional chip substrates. In this manner, the chip substrate assembly 22 allows for faster cool-down times of the chip assembly and a detector thereof. The chip substrate assembly 22 also allows for reduced size and thermal capacity of alternative cooling sources.

Figure 5:
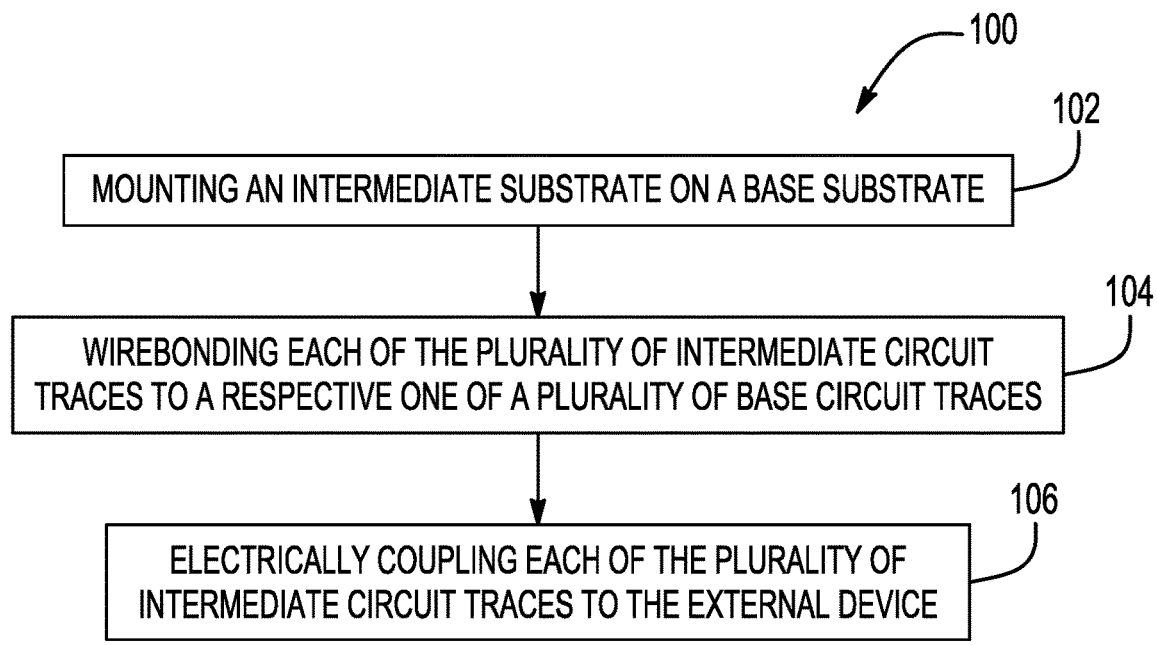
FIG. 5 is a flowchart of a method of electrically coupling a chip assembly mounted on a base substrate to an external device, according to another aspect of this disclosure.

With reference to FIG. 5, a method 100 of electrically coupling a chip assembly (e.g., a sensor chip assembly) mounted on a base substrate to an external device is depicted. The chip assembly, for example, may be mounted on the base substrate 28 of the substrate assembly 24 described above (FIGS. 3 and 4). The method therefore includes the step 102 of mounting an intermediate substrate, such as the intermediate substrate 26 (FIGS. 3 and 4), on the base substrate adjacent a plurality of base circuit traces, such as the base circuit traces 30 (FIGS. 3 and 4), mounted on the base substrate. The step 102 of mounting the intermediate substrate may include spacing at least a portion of the intermediate substrate apart from the base substrate such that a gap, such as the gap 48 described above (FIG. 4), is provided between the portion of the intermediate substrate and the base substrate. The intermediate substrate includes a plurality of intermediate circuit traces, such as the intermediate circuit traces 32 (FIGS. 3 and 4). The method then includes the step 104 of wirebonding each of the plurality of intermediate circuit traces to a respective one of the plurality of base circuit traces. Such wirebonding serves to electrically couple each of the plurality of intermediate circuit traces to a respective one of the plurality of base circuit traces. The method 100 then includes the step 106 of electrically coupling each of the plurality of intermediate circuit traces to the external device.

For example, the step 106 of electrically coupling each of the plurality of intermediate circuit traces to the external device may include the steps of providing a feedthrough device, such as the feedthrough device 34 (FIGS. 3 and 4) described above. The feedthrough device has a plurality of feedthrough circuit traces mounted thereon. The step 106 of electrically coupling each of the plurality of intermediate circuit traces to the external device may then include the step of wirebonding each of the plurality of feedthrough circuit traces to a respective one of the plurality of intermediate circuit traces on the intermediate substrate. The step of wirebonding each of the plurality of intermediate circuit traces to a respective one of the plurality of base circuit traces may include wirebonding each of the plurality of intermediate circuit traces to a respective one of the plurality of base circuit traces with a respective gold or silver wirebond. Such wirebonding serves to electrically couple each of the plurality of feedthrough circuit traces to a respective one of the plurality of intermediate circuit traces on the intermediate substrate. In this manner, the external device electrically coupled to the feedthrough device may therefore be electrically coupled to the chip assembly mounted on the base substrate of the substrate assembly.

Although this disclosure has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described elements (components, assemblies, devices, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function in the herein illustrated exemplary embodiment or embodiments of this disclosure. In addition, while a particular feature of this disclosure may have been described above with respect to only one or more of several illustrated embodiments, such feature may be combined with one or more other features of the other embodiments, as may be desired and advantageous for any given or particular application.

What is claimed is:

1. A substrate, comprising:
a base substrate having a plurality of base circuit traces mounted directly thereon for supporting a chip assembly; and
an intermediate substrate mounted directly on the base substrate adjacent the plurality of base circuit traces, the intermediate substrate having a plurality of intermediate circuit traces mounted thereon, each of the plurality of intermediate circuit traces being wirebonded to a respective one of the plurality of base circuit traces;
wherein the plurality of intermediate circuit traces are configured to be electrically coupled to an external device; and
wherein a material of the base substrate has a first thermal conductivity and a material of the intermediate substrate has a second thermal conductivity that is lower than the first thermal conductivity.

2. The substrate according to claim 1, wherein the second thermal conductivity is lower than the first thermal conductivity by a factor that is within an order of magnitude of 50.

3. The substrate of claim 1, wherein the material of the base substrate is any one of aluminate (AlO2) and aluminum nitride (AlN).

4. The substrate of claim 1, wherein the material of the intermediate substrate is at least one of steatite, yttria, forsterite, cordierite, and zirconia.

5. The substrate of claim 1, wherein the plurality of intermediate circuit traces are each wirebonded to a respective one of the plurality of base circuit traces with a respective gold wirebond.

6. The substrate of claim 1, wherein the plurality of intermediate circuit traces are each wirebonded to a respective one of the plurality of base circuit traces with a respective silver wirebond.

7. The substrate of claim 1, wherein the plurality of base circuit traces and the plurality of intermediate circuit traces are made of gold.

8. The substrate of claim 1, wherein at least a portion of the intermediate substrate is spaced apart from the base substrate with an air gap between the portion of the intermediate substrate and the base substrate.

9. A substrate assembly, comprising:
a substrate including:
a base substrate having a plurality of base circuit traces mounted directly thereon for supporting a chip assembly; and
an intermediate substrate mounted directly on the base substrate adjacent the plurality of base circuit traces, the intermediate substrate having a plurality of intermediate circuit traces mounted thereon, each of the plurality of intermediate circuit traces being wirebonded to a respective one of the plurality of base circuit traces; and
a feedthrough device having a plurality of feedthrough circuit traces mounted thereon, each of the plurality of feedthrough circuit traces being wirebonded to a respective one of the plurality of intermediate circuit traces;
wherein a material of the base substrate has a first thermal conductivity and a material of the intermediate substrate has a second thermal conductivity that is lower than the first thermal conductivity.

10. A method of electrically coupling a chip assembly mounted on a base substrate to an external device, the method comprising the steps of:
mounting an intermediate substrate directly on the base substrate adjacent a plurality of base circuit traces mounted directly on the base substrate, the intermediate substrate including a plurality of intermediate circuit traces mounted thereon;
wirebonding each of the plurality of intermediate circuit traces to a respective one of the plurality of base circuit traces; and
electrically coupling each of the plurality of intermediate circuit traces to the external device;
wherein a material of the base substrate has a first thermal conductivity and a material of the intermediate substrate has a second thermal conductivity that is lower than the first thermal conductivity.

11. The method according to claim 10, wherein the step of electrically coupling each of the plurality of intermediate circuit traces to the external device includes the steps of:
providing a feedthrough device having a plurality of feedthrough circuit traces mounted thereon; and
wirebonding each of the plurality of feedthrough circuit traces to a respective one of the plurality of intermediate circuit traces on the intermediate substrate.

12. The method according to claim 10, wherein the second thermal conductivity is lower than the first thermal conductivity by a factor that is within an order of magnitude of 50.

13. The method according to claim 10, wherein the material of the base substrate is any one of aluminate (AlO2) and aluminum nitride (AlN).

14. The method according to claim 10, wherein the material of the intermediate substrate is at least one of steatite, yttria, forsterite, cordierite, and zirconia.

15. The method according to claim 10, wherein the step of wirebonding each of the plurality of intermediate circuit traces to a respective one of the plurality of base circuit traces includes wirebonding each of the plurality of intermediate circuit traces to a respective one of the plurality of base circuit traces with a respective gold wirebond.

16. The method according to claim 10, wherein the step of wirebonding each of the plurality of intermediate circuit traces to a respective one of the plurality of base circuit traces includes wirebonding each of the plurality of intermediate circuit traces to a respective one of the plurality of base circuit traces with a respective silver wirebond.

17. The method according to claim 10, wherein the plurality of base circuit traces and the plurality of intermediate circuit traces are made of gold.

18. The method according to claim 10, wherein the step of mounting the intermediate substrate on the base substrate includes spacing at least a portion of the intermediate substrate apart from the base substrate such that an air gap is provided between the portion of the intermediate substrate and the base substrate.

* * * * *